United States Patent
Chen

(10) Patent No.: US 10,978,534 B2
(45) Date of Patent: Apr. 13, 2021

(54) ARRAY SUBSTRATE HAVING PARALLEL CAPACITORS IN COMPENSATION CIRCUIT

(71) Applicant: Wuhan China Star Optoelectronics Semiconductor Display Technology Co., Ltd., Wuhan (CN)

(72) Inventor: Caiqin Chen, Wuhan (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 40 days.

(21) Appl. No.: 16/317,580

(22) PCT Filed: Sep. 6, 2018

(86) PCT No.: PCT/CN2018/104262
§ 371 (c)(1),
(2) Date: Jan. 14, 2019

(87) PCT Pub. No.: WO2020/037717
PCT Pub. Date: Feb. 27, 2020

(65) Prior Publication Data
US 2020/0119121 A1    Apr. 16, 2020

(30) Foreign Application Priority Data

Aug. 21, 2018 (CN) .......................... 201810951224.9

(51) Int. Cl.
*H01L 27/32* (2006.01)
*H01L 27/12* (2006.01)
*H01L 29/786* (2006.01)

(52) U.S. Cl.
CPC ...... *H01L 27/3265* (2013.01); *H01L 27/3262* (2013.01); *H01L 27/3276* (2013.01); *H01L 27/124* (2013.01); *H01L 27/1222* (2013.01); *H01L 27/1255* (2013.01); *H01L 29/78675* (2013.01)

(58) Field of Classification Search
CPC ..... H01L 27/3265; H01L 27/326–3276; H01L 23/5223; H01L 27/124; H01L 27/3262
See application file for complete search history.

(56) References Cited

U.S. PATENT DOCUMENTS

| | | | |
|---|---|---|---|
| 2007/0241422 A1* | 10/2007 | Chen | H01L 23/5223 257/528 |
| 2014/0141574 A1 | 5/2014 | Zhan et al. | |
| 2016/0372497 A1* | 12/2016 | Lee | G02F 1/136213 |
| 2019/0148477 A1* | 5/2019 | Park | H01L 27/3276 257/40 |

FOREIGN PATENT DOCUMENTS

| | | |
|---|---|---|
| CN | 102269901 | 12/2011 |
| CN | 107785399 | 3/2018 |
| JP | H05-226582 | 9/1993 |

* cited by examiner

*Primary Examiner* — Suberr L Chi

(57) ABSTRACT

The present disclosure provides an array substrate, including: a base substrate, a first metal, a buffer layer, a second metal, a second buffer layer, a third metal. A via is defined in the first buffer layer and the second buffer layer to electrically interconnect the first metal and the third metal, so that the first metal, the second metal and the third metal constitute parallel capacitors.

4 Claims, 1 Drawing Sheet

US 10,978,534 B2

ARRAY SUBSTRATE HAVING PARALLEL CAPACITORS IN COMPENSATION CIRCUIT

RELATED APPLICATIONS

This application is a National Phase of PCT Patent Application No. PCT/CN2018/104262 having International filing date of Sep. 6, 2018, which claims the benefit of priority of Chinese Patent Application No. 201810951224.9 filed on Aug. 21, 2018. The contents of the above applications are all incorporated by reference as if fully set forth herein in their entirety.

FIELD AND BACKGROUND OF THE INVENTION

The present disclosure relates to the field of displays, and in particular to an array substrate.

There are still apparent defects in AMOLED display panels. For example, due to uneven manufacturing of panels and a threshold voltage of each driving thin film transistors is different, resulting in display difference of the light emission between pixels. A compensation circuit is used to reduce the display difference of the light emission between the pixels in the prior art.

In the compensation circuit of a pixel circuit, capacitors are key components for storing the turn-on potential and the compensation potential of thin film transistors. Therefore, the performance of the capacitors plays an important role in the working process of the pixel circuit.

In general, in order to maintain the stability of the potential of one end of a capacitor in the pixel, it is necessary to increase the size of the storage capacitor as much as possible in the pixel space. However, with the requirements of high definition of display panels, the size of a storage capacitor becomes smaller as the pixel definition of the display panels increases. FIG. 1 illustrates a diagram of the structure of an array substrate having a storage capacitor in the prior art, in which the storage capacitor constituted with a first gate 12 and a second gate 13 occupies a large space of the array substrate, and as a result, the size of the storage capacitor becomes a cause of limiting the increase of number of pixels of display panels. Therefore, it is necessary to provide an array substrate to solve the above problems.

In existing display panels, there is a problem that the requirements of setting high pixel value of the array substrates and increasing the capacitance of a storage capacitor in a compensation circuit cannot be satisfied at the same time.

SUMMARY OF THE INVENTION

To achieve the above objects, the present disclosure provides the following technical solution:

the present disclosure provides an array substrate, including:
a base substrate;
a first metal disposed on the base substrate;
a first buffer layer disposed on the first metal;
a second metal disposed on the first buffer layer;
a second buffer layer disposed on the second metal;
a third metal disposed on the second buffer layer;
wherein a via is defined in the first buffer layer and the second buffer layer, the first metal is electrically connected to the third metal through the via, and the first metal, the second metal and the third metal constitute parallel capacitors.

According to one embodiment of the present disclosure, the first metal is a gate metal and the third metal is located in a source/drain metal layer of the array substrate.

According to one embodiment of the present disclosure, a polycrystalline silicon layer including a channel region in the middle and doping regions at two ends is disposed between the base substrate and the first metal; and
wherein the first metal, the second metal and the third metal are all located above the channel region.

According to one embodiment of the present disclosure, the via penetrates through the first buffer layer and the second buffer layer, and
the via separates the second metal, and the second metal is spaced from the via.

According to one embodiment of the present disclosure, the source/drain metal layer includes source-drain metal electrodes and the third metal, which are insulated from each other; and
wherein the source-drain metal electrodes connect with the polycrystalline silicon layer of a thin film transistor.

According to another aspect of the present disclosure, an array substrate is provided, including:
a base substrate;
a first metal disposed on the base substrate;
a first buffer layer disposed on the first metal;
a second metal disposed on the first buffer layer;
a second buffer layer disposed on the second metal;
a third metal disposed on the second buffer layer and located in an anode layer of the array substrate;
wherein a via is defined in the first buffer layer and the second buffer layer, the first metal electrically connects with the third metal through the via, the first metal, the second metal and the third metal constitute parallel capacitors, the via penetrates through the first buffer layer and the second buffer layer, the via separates the second metal, and the second metal is spaced from the via.

According to one embodiment of the present disclosure, the first metal is a gate metal, and the second metal is located in a source/drain metal layer.

According to one embodiment of the present disclosure, a polycrystalline silicon layer including a channel region in the middle and doping regions at two ends is disposed between the base substrate and the first metal; and
wherein the first metal, the second metal and the third metal are all located above the channel region.

According to one embodiment of the present disclosure, the anode layer includes an anode metal and the third metal mutually insulated; and
wherein the anode metal is connected source-drain metal electrodes.

According to another aspect of the present disclosure, an array substrate is provided, including:
a base substrate;
a first metal disposed on the base substrate;
a first buffer layer disposed on the first metal;
a second metal disposed on the first buffer layer;
a second buffer layer disposed on the second metal;
a third metal disposed on the second buffer layer and located in an anode layer of the array substrate;
wherein a via is defined in the first buffer layer and the second buffer layer, the first metal electrically connects with the third metal through the via, and the first metal, the second metal and the third metal constitute parallel capacitors.

According to one embodiment of the present disclosure, the first metal is a gate metal, and the second metal is located in a source/drain metal layer.

According to one embodiment of the present disclosure, a polycrystalline silicon layer including a channel region in the middle and doping regions at two ends is disposed between the base substrate and the first metal; and wherein the first metal, the second metal and the third metal are all located above the channel region.

According to one embodiment of the present disclosure, the anode layer includes an anode metal and the third metal mutually insulated; and wherein the anode metal is connected with source-drain metal electrodes.

Advantageous effect of the present invention is to provide an array substrate, in which capacitors constituted between the gate metal, source-drain metal electrodes and the capacitive metal are connected in parallel by interconnecting the gate metal with the capacitive metal or the source-drain metal electrodes, thereby increasing the capacitance of the compensation circuit while maintaining a pixel size so as to achieve high definition of a display panel.

BRIEF DESCRIPTION OF THE SEVERAL VIEWS OF THE DRAWINGS

To describe the technical solutions in the embodiments of the present invention or in the prior art more clearly, the following briefly introduces the accompanying drawings required for describing the embodiments. Apparently, the accompanying drawings in the following description show merely some embodiments of the present invention, and a person of ordinary skill in the art may still derive other drawings from these accompanying drawings without creative efforts.

DESCRIPTION OF SPECIFIC EMBODIMENTS OF THE INVENTION

Figure 1:
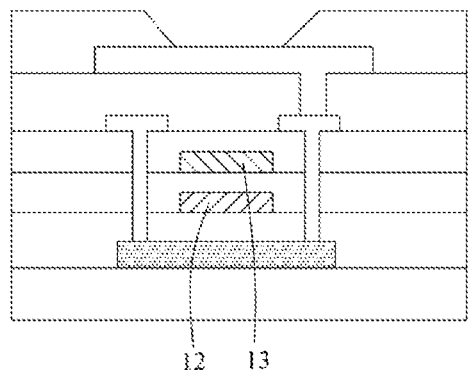
FIG. 1 illustrates a diagram of the structure of an array substrate in the prior art.

The description given below for the various embodiment is made with reference to the attached drawings to illustrate, in exemplificative form, specific embodiments of the present invention. Furthermore, the directional terms described in the present disclosure, such as upper, lower, front, rear, left, right, inside, outer, side, etc., are only directions with reference to the accompanying drawings, so that the used directional terms are used to describe and understand the present disclosure, but not to limit the present disclosure. In the drawings, components with similar structures are labeled by the same numerals.

An array substrate is provided in the present disclosure, the defects that requirements of setting high pixel value of the array substrates and increasing the capacitance of a storage capacitor in a compensation circuit cannot be simultaneously satisfied can be solved by the present embodiment.

Figure 2:
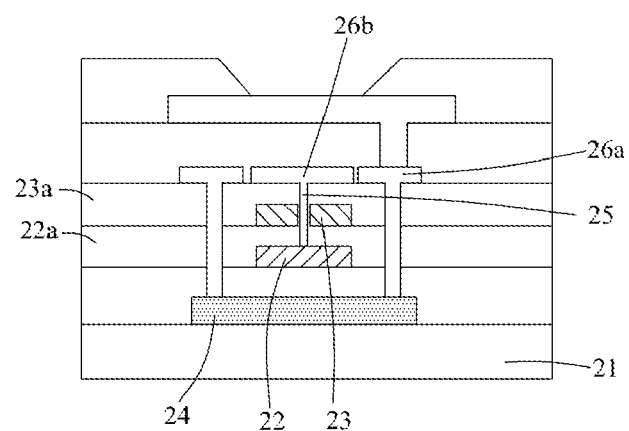
FIG. 2 illustrates a diagram of the structure of an array substrate according to one embodiment of the present disclosure; and, FIG. 3 illustrates a diagram of the structure of an array substrate according to another embodiment of the present disclosure.
Figure 3:
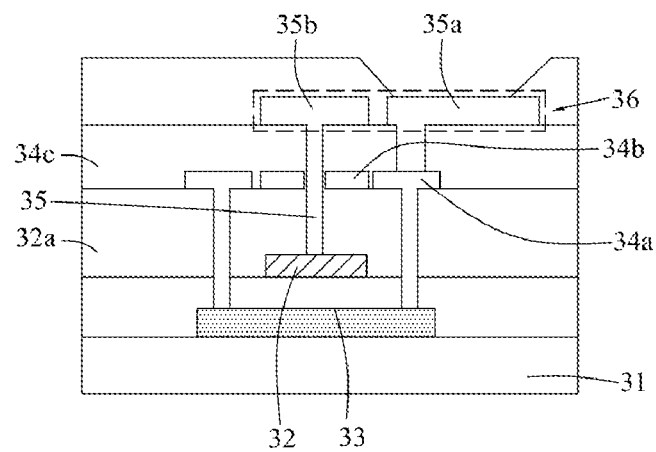

FIG. 2 illustrates a diagram of the structure of an array substrate according to one embodiment of the present disclosure; and, FIG. 3 illustrates a diagram of the structure of an array substrate according to another embodiment of the present disclosure.

The present disclosure will be further described below in conjunction with the accompanying drawings and specific embodiments.

As shown in FIG. 2, the present disclosure provides an array substrate, including:

a base substrate 21;

a first metal 22 disposed on the base substrate 21;

a first buffer layer 22a disposed on the first metal 22;

a second buffer layer 23a disposed on the second metal 23;

a second buffer layer disposed on the second metal 23;

a third metal 26b disposed on the second buffer layer;

wherein a via 25 is defined in the first buffer layer 22a and the second buffer layer 23a, the first metal 22 electrically connects with the third metal 26b through the via 25, and the first metal 22, the second metal 23, and the third metal 26b constitute parallel capacitors.

In general, the base substrate 21 includes a substrate and a buffer layer. The substrate may be either a rigid substrate or a flexible substrate and may be determined according to the type of the array substrate and actual needs.

Thin film transistors are formed on the array substrate and usually include a polycrystalline silicon layer 24, gates, a gate insulating layer, and source-drain metal electrodes 26a and an insulating layer.

Further, capacitors are constituted between the gate metal and the capacitive metal.

In the present disclosure, the first metal is the gate, the second metal 23 is the capacitive metal, and the third metal 26b is located in the source/drain metal layer; that is, the third metal 26b and the source-drain metal electrodes 26a can be prepared in one process.

Specifically, to constitute parallel capacitors with the first metal 22, the second metal 23 and the third metal 26b, it's necessary to apply a same voltage to the first metal 22 and the third metal 26b, and the first metal 22 is electrically connected with the third metal 26b through the via 25;

wherein the via 25 penetrates through the first buffer layer 22a and the second buffer layer 23a, meanwhile, the via 25 separates the second metal 23 into two portions and the second metal 23 is spaced from the via 25 in order to avoid interference of the via 25 on the second metal 23. The pattern of the third metal 26b can be prepared in one process during the preparation of the source-drain metal electrodes 26a without an additional process.

In the present disclosure, by the parallel arrangement of the first metal 22, the second metal 23 and the third metal 26b, capacitance value of the capacitor is increased without increasing the size of the capacitor occupied in a pixel, so as to improve the display performance of the pixel. That is, the capacitance value of the capacitor can be kept constant while reducing the size of the pixel, thereby making the display panels high-definition.

A polycrystalline silicon layer 24 including a channel region in the middle and doping regions at two ends is disposed between the base substrate 21 and the first metal 22;

wherein the first metal 22, the second metal 23 and the third metal 26b are all located above the channel region.

Preferably, the source/drain metal layer includes source-drain metal electrodes 26a and the third metal 26b mutually insulated;

wherein the source-drain metal electrodes 26a is connected to the polycrystalline silicon layer 24 of the thin film transistor.

As shown in FIG. 3, an array substrate is provided according to another aspect of the present disclosure, comprising:

a base substrate 31;

a first metal 32 disposed on the base substrate 31;

a first buffer layer 32a disposed on the first metal 32;

a second metal 34b disposed on the first buffer layer;

a second buffer layer 34c disposed on the second metal 34b;

a third metal 35b disposed on the second buffer layer 34c and is located in an anode layer 36 of the array substrate;

wherein a via 35 is defined in the first buffer layer 32a and the second buffer layer 34c, the first metal 32 electrically connects with the third metal 35b through the via 35, and the first metal 32, the second metal 34b and the third metal 35b constitute parallel capacitors.

The first metal 32 is a gate metal, and the second metal 34b is located in a source/drain metal layer.

Preferably, a polycrystalline silicon layer 33 comprising a channel region in the middle and doping regions at two ends is disposed between the base substrate 31 and the first metal 32;

wherein the first metal 32, the second metal 34b and the third metal 35b are all located above the channel region.

Preferably, the via penetrates through the first buffer layer and the second buffer layer;

the via separates the second metal 34b, and the second metal 34b is spaced from the via.

Further, the anode layer comprises an anode metal 35a and the third metal 35b mutually insulated, so that the third metal 35b and the anode metal 35a can be prepared in one photomask process;

wherein the anode metal 35a is connected with the source-drain metal electrodes 34a.

It can be understood that the array substrate is an organic light emitting array substrate.

Compared with the above embodiment in which parallel capacitors are constituted with the metal in the same layer as the source-drain electrodes, the gate and the capacitive metal, the parallel capacitors in the embodiment of the present disclosure are constituted with the metal in the same layer as the source-drain metal electrodes, the gate and the metal in the same layer as the anode. Both of these two embodiments of different structures can achieve the effect of increasing the pixel capacitance value and can be chosen according to the actual situation.

Advantageous effect of the present invention is to provide an array substrate, in which capacitors formed between the gate metal, the source-drain metal electrodes and the capacitive metal are connected in parallel by interconnecting the gate metal with the capacitive metal or the source-drain metal electrodes, thereby increasing the capacitance of the compensation circuit while maintaining a pixel size so as to achieve high definition of a display panel.

The present disclosure has been described with relative embodiments which are examples of the present disclosure only. It should be noted that the embodiments disclosed are not the limit of the scope of the present disclosure. Conversely, modifications to the scope and the spirit of the claims, as well as the equal of the claims, are within the scope of the present disclosure.

What is claimed is:

1. An array substrate, comprising:

a base substrate;

a first metal disposed on the base substrate;

a first buffer layer disposed on the first metal;

a second metal disposed on the first buffer layer;

a second buffer layer disposed on the second metal;

a third metal disposed on the second buffer layer;

wherein a via is defined in the first buffer layer and the second buffer layer, the first metal is electrically connected to the third metal through the via, and the first metal, the second metal, and the third metal constitute parallel capacitors;

wherein the via separates the second metal into two portions, and the second metal is spaced from the via;

wherein the first metal is a gate metal and the third metal is in a source/drain metal layer of the array substrate.

2. The array substrate according to claim 1, wherein a polycrystalline silicon layer comprising a channel region in a middle and doping regions at two ends is disposed between the base substrate and the first metal; and wherein the first metal, the second metal, and the third metal are all located above the channel region.

3. The array substrate according to claim 2, wherein the via penetrates through the first buffer layer and the second buffer layer.

4. The array substrate according to claim 3, wherein the source/drain metal layer comprises source-drain metal electrodes and the third metal, which are insulated from each other; and wherein the source/drain metal layer is connected with the polycrystalline silicon layer of a thin film transistor.

* * * * *